United States Patent [19]

Binstead

[11] Patent Number: 4,954,823
[45] Date of Patent: Sep. 4, 1990

[54] TOUCH KEYBOARD SYSTEMS

[76] Inventor: Ronald P. Binstead, 15 Seely Road, Radford, Nottingham, England

[21] Appl. No.: 323,251

[22] Filed: Mar. 9, 1989

Related U.S. Application Data

[63] Continuation of Ser. No. 160,707, Feb. 26, 1988, abandoned, which is a continuation-in-part of Ser. No. 21,639, Mar. 4, 1987, abandoned, which is a continuation-in-part of Ser. No. 828,326, Jan. 28, 1986, abandoned.

[30] Foreign Application Priority Data

Apr. 16, 1985 [WO] PCT Int'l
Appl. .................. PCT/GB85/00168

[51] Int. Cl.⁵ .............................................. G06F 3/14
[52] U.S. Cl. ........................................ 341/26; 341/33
[58] Field of Search ........... 340/305 C, 365 E, 365 L, 340/365 R, 365 S; 341/26, 33

[56] References Cited

U.S. PATENT DOCUMENTS

| | | | |
|---|---|---|---|
| 4,145,748 | 3/1979 | Eichelberger et al. | 340/365 C |
| 4,237,421 | 12/1980 | Waldron | 340/365 C |
| 4,290,052 | 9/1981 | Eichelberger et al. | 340/365 C |
| 4,363,029 | 12/1982 | Piliavin et al. | 340/365 C |
| 4,374,381 | 2/1983 | Ng et al. | 340/365 C |
| 4,529,967 | 7/1985 | Gifft | 340/365 E |
| 4,543,564 | 9/1985 | Audoin et al. | 340/365 C |

FOREIGN PATENT DOCUMENTS 0085636 5/1983 Japan.
2080990 2/1982 United Kingdom.

*Primary Examiner*—Alvin Oberley
*Attorney, Agent, or Firm*—Cahill, Sutton & Thomas

[57] ABSTRACT

A display can be controlled through one or more thicknesses of glass and one or more air gaps using a transparent keypad through which the display can be observed. The display may be a TV, LCD or other type.

19 Claims, 14 Drawing Sheets

MAIN PROGRAM

START UP
↓
INITIALISE
↓
→ SCAN KEYS
↑ ↓
│ PROCESS RESULTS
│ ↓
│ COMPENSATE FOR DRIFT
└──────┘

Fig. 13

INITIALISE

INITIALISE
↓
SCAN KEYS (READ NEW KEY)
↓
SET ALL OLD KEY READINGS EQUAL TO NEW KEY ONES
↓
RETURN

Fig. 14

SCAN KEYS

SCAN KEYS
↓
START SCAN I = ∅
↓
→ READ KEY = NEW-KEY$_I$
↑ ↓
│ I = I + 1
│ ↓
│ I > LAST KEY
└NO      YES↓
         RETURN

Fig. 15

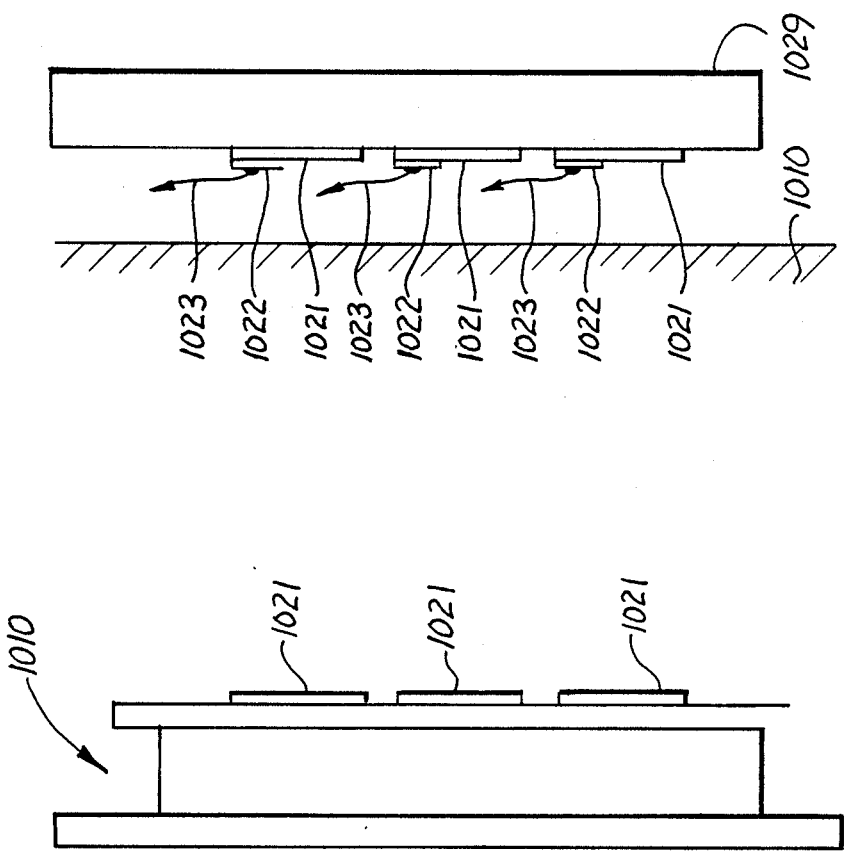

TOUCH KEYBOARD SYSTEMS

RELATED APPLICATIONS

This application is a continuation of Ser. No. 160,707 filed Feb. 26, 1988, now abandoned, which is a continuation-in-part of Ser. No. 021,639 filed Mar. 4, 1987, now abandoned, which is a continuation-in-part of Ser. No. 828,326 filed January 28, 1986, now abandoned.

BACKGROUND OF THE INVENTION

1. Field of the Invention

The present invention relates to touch operated keyboards and more particularly to touch operated keyboards which may be operated through an unknown thickness of glass.

2. Description of the Related Art

In this specification the term glass is used since the keyboard will normally be operated through clear glass. The term glass is however to be interpreted to include any insulating material whether clear or opaque. With an opaque insulating material it is normally necessary to have an external faceplate to identify the touch area for each key. In other respects the problems of coping with various thicknesses of glass are the same whether it is clear or opaque.

GB Patent Application No. 2011089 (equivalent to U.S. Pat. No. 4,145,748 and DE. No. 2854539) shows a touch pad sensor circuit which is self optimising. In this system the pads are addressed by respective drive pulses to give output values, the previous "no touch" value of each pad being stored in a memory for comparison with each new value. Thus only when the new value exceeds the old by a predetermined amount will the circuitry decide that a key has been operated. This system suffers from the disadvantage that if a large capacitive object suddenly comes close to all the keys then the decision logic circuitry will conclude that all keys have been operated. Additionally the system is not sensitive enough to operate through very thick glass as found in shop windows because the thick glass produces only a small capacitive change when touched. Thus whilst this known system is acceptable in a home environment on for example kitchen ranges (see page 1 lines 8-14) it is not practical for shop windows where the glass is thicker and where large capacitive disturbances are possible.

SUMMARY OF THE INVENTION

It is an object of the present invention to provide a touch operated keyboard which is suitable for operation through window glass of the type and thickness found in shop windows and which is relatively insensitive to large capacitive disturbances affecting the whole or a substantial part of the keyboard.

It is also an object of the present invention to provide a transparent touch keypad system which is operable through glass or transparent plastics material It is also an object of the present invention to provide a transparent keypad which can be attached to the front screen of a VDU for viewing the VDU through the keypad.

According to the present invention, there is provided a touch operated key system including a keyboard comprising a plurality of keypads, means for attaching the keyboard to a sheet of glass (as herein defined) for operation through the glass and including apparatus for the display of data and for control of processes selectable by the keyboard, the apparatus including processing circuitry for processing signals from the keyboard to automatically compensate for variations in the environment in which the keyboard is placed, to thereby maintain sensitivity of the keypads when the keyboard is used on different thicknesses of glass and to automatically compensate for the effects of environmental factors which give rise to instantaneous and gradual disturbances in the signals from one or more of the keypads by continuously adjusting elements of the processing circuitry in response to such disturbances.

According to the present invention, there is preferably further provided a touch operated key system, in which the system includes interrogation means for interrogating the output signals from one or more of the keypads, sensing means associated with the keyboard for detecting and processing the outputs of the one or more keypads, in which the sensing means includes comparison means for comparing the output of the keypad being interrogated with the output of at least one other keypad, to determine as a result of the comparison the condition of the keypad being interrogated.

According to the present invention there is also preferably provided a touch operated keyboard for attachment to the one side of a sheet of glass for actuation through the sheet of glass, comprising a plurality of keypads disposed adjacent each other in a desired pattern, interrogation means for interrogating each keypad to assess the present condition of each keypad and including signal processing means connected to receive the output of each keypad, the signal processing means including common processing means for two or more of the keypads.

In a preferred embodiment the common processing means is connected to the outputs of all keypads on the touch operated keyboard.

In a further embodiment one or more of the keypads may be used for comparison purposes only and is not an operative keypad. In such a case there is no need for the keypad used for comparison to be visible to the user.

Preferably the output signal from each keypad is in the form of a value of capacitance, which value changes in accordance with a number of extraneous factors and due to a factor which it is desired to detect which is produced by a finger or similar object being placed in proximity to a keypad on the opposite side of the glass to the keypad. The signal processing means preferably includes means for detecting changes at one or more of the keypads due to the extraneous factors and means for comparing the changes with the signal received from an interrogated keypad to determine the presence of a finger or similar object.

The object which touches the opposite side of the glass to the keypad will be referred to hereinafter as a finger. It could be any object that would cause an increase in the capacitance of the keypad. Additionally the finger would not necessarily have to touch the glass but could be held extremely close to the glass to achieve the same effect. Thus also for the purpose of the present invention touch is meant to indicate holding in close proximity. It is for this reason that the other extraneous factors are relevant because when one finger of a hand is touching the glass the other fingers will be close to other keys and will have an effect on those keys.

The capacitance generated by the touching finger through relatively thick window glass is extremely small and its detection in the presence of other extraneous effects is difficult. The most important extraneous effects are caused by large capacitive effects over several keys as with the close presence of a hand, the "peeling off" of part of the keyboard from the inside of the glass thus decreasing the contact between certain keypads and the glass rendering those keys relatively less sensitive; sunlight or other temperature deviations causing changes in the glass characteristics and in the characteristics of the electronic circuitry, rain on the outside of the window causing greater coupling between keypads and other more minor effects caused for example by wind, dust, grease, humidity, etc. The present invention therefore incorporates a number of design features to compensate for the results of the above superimposed extraneous effects.

In particular in a preferred embodiment the processing circuitry includes drift compensation means for compensating for relatively long term drifting of the output of one or more keys relative to an average value for all keys, the drift compensation means providing an adjustment for each key drifting from the average value to adjust the output of the key when in a non-operated condition towards the average value.

The present invention also provides a touch keypad system including a visual display system unit, a transparent keypad comprising a plurality of sensitive areas, in which the keypad is operable through glass by touching the glass the display being viewed at lease in part through the keypad.

In a preferred embodiment the keypad is attached to the front of a VDU and the VDU is positioned adjacent to one side of a sheet of glass or plastic the VDU being controllable by touching the opposite side of the glass or plastic.

In this preferred embodiment the system includes means for distinguishing the touching of a key of the keypad attached to or in close proximity to the screen of a VDU in the presence of static developed by the VDU.

BRIEF DESCRIPTION OF THE DRAWINGS

Embodiments of the present invention will now be described, by way of example with reference to the accompanying drawings, in which:

FIG. 13 shows a main program for a microprocessor for processing the signals by digital means;

FIG. 14 shows in greater detail an initialise routine for the program of FIG. 13;

FIG. 15 shows in greater detail a scan key routine for the program of FIG. 13;

FIGS. 25 to 30 show in cross section various designs of keypad and display.

DESCRIPTION OF THE PREFERRED EMBODIMENT

Figure 1:
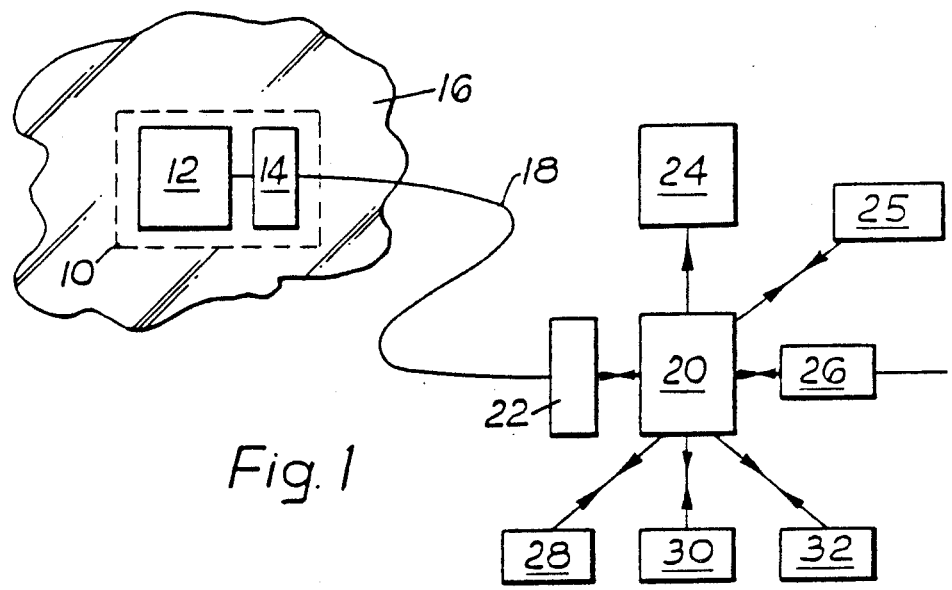
FIG. 1 shows a touch operated keyboard system according to the present invention.

With reference now to FIG. 1 the touch operated keyboard system includes a keyboard assembly 10 comprising a sensor pad 12 and interface circuitry 14 mounted on a glass (insulator) surface 16. Output signals from circuitry 14 are transmitted on a link 18 to a computer 20 via an interface 22. The computer may control and/or receive instructions from a variety of apparatus such as a visual display unit (VDU) 24; an industrial control 25; a modem 26 for communication with a general computer network, for example via a telephone link; a video tape or disk recorder 28; a mass storage (e.g. fixed disk) apparatus 30; and a remote computer 32 which could for example control a further visual display (not shown) at the remote location The industrial control could be an electro-mechanical device for control of an industrial process or could be a robot or projector for operation in a shop window.

Figure 2:
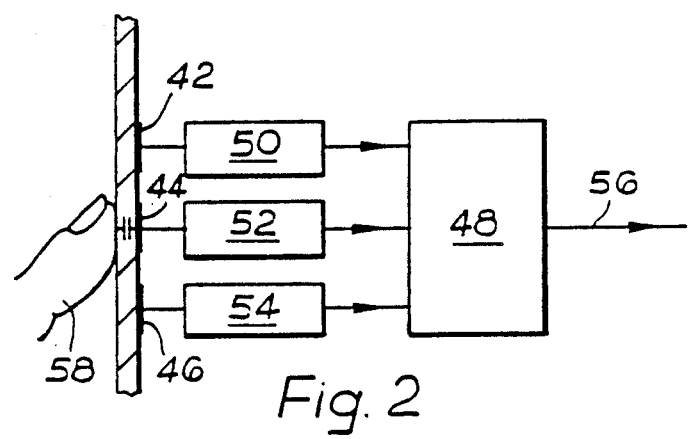
FIG. 2 illustrates in basic detail a known keypad suitable for operation through relatively thin glass.
Figure 3:
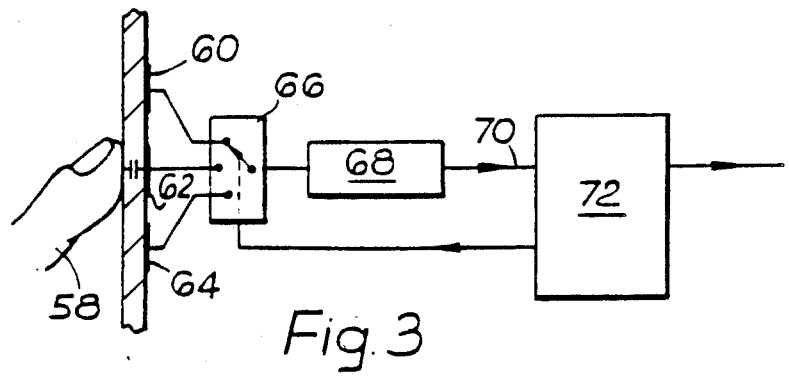
FIG. 3 shows in basic detail a more sensitive keypad according to the present invention for operation through various thicknesses of glass both thin and thick.

With reference now to FIG. 2 a known keyboard sensing system is shown. Each pad 42, 44, 46 etc is connected to a decision circuit 48 which receives the outputs from the pads via respective capacitance transducers 50, 52, 54 and on the basis of a change in capacitance provides an output on line 56 indicative of the key touched by a finger 58. A first disadvantage of this design is that the decision circuit needs to be built into the keyboard. If not then a large number of connections will be required between the decision circuit and each capacitive transducer. Thus for a 4×3 keyboard at least twelve leads would be required Another disadvantage is reduced sensitivity owing to differences between the capacitive transducers caused by component tolerance and different responses caused by changing environmental conditions.

A further disadvantage is the large number of components required on the keyboard.

In the arrangement according to the present invention the keyboard includes keypads 60, 62, 64 etc connected via an analogue multiplexer 66 to a single capacitance transducer 68 from which a single wire 70 is connected to a decision circuit 72. The decision circuit 72 controls the position of the analogue multiplexer 66. Thus the capacitance transducer is common to all keypads and therefore no errors are introduced through mismatching of the capacitive transducers 50, 52, 54 as in FIG. 2. Additionally since only a single wire is connected to decision circuit 72 the decision circuit can, with a suitable choice of output signals from capacitive transducer 68, be a considerable distance from the transducer 68. Thus the circuitry in the keyboard interface 14 can be relatively simple since it does not require that the decision making process is carried out in close proximity.

Thus the keyboard assembly 10 which is affixed to the glass 16 can be made relatively slim such that it can fit between the glass of a shop window and a metal mesh security screen pulled down behind the glass.

Figure 4:
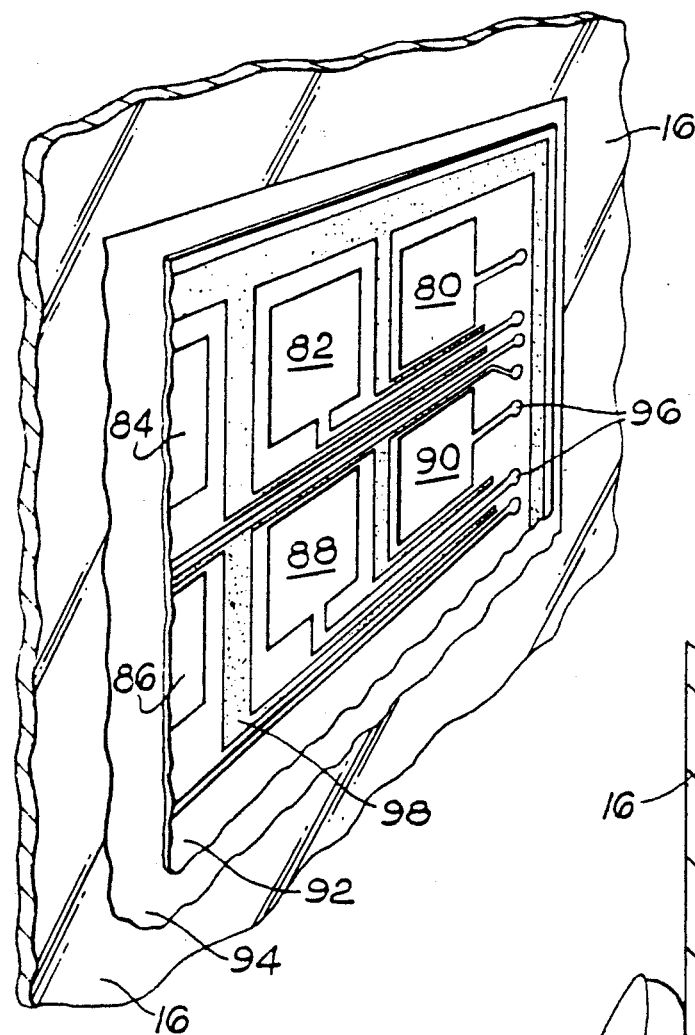
FIG. 4 shows a partially sectional rear view of the keypad of FIG. 3.
Figure 5:
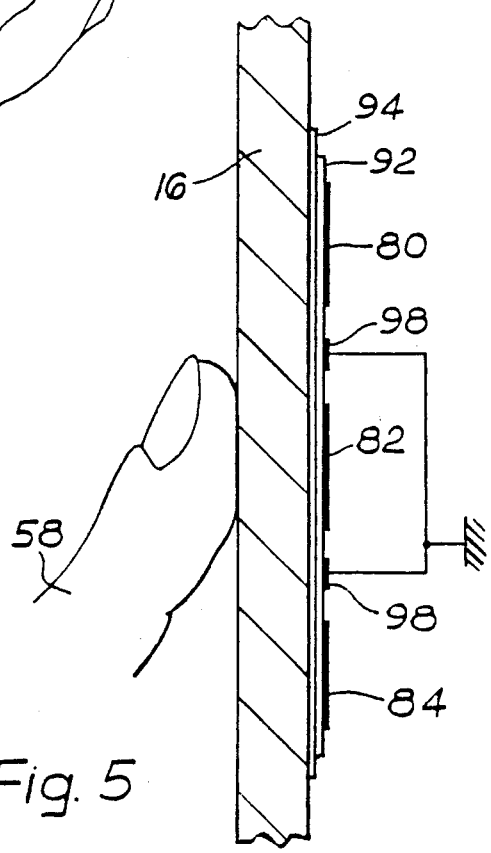
FIG. 5 shows a cross-section through the keypad of FIG. 4.

With reference to FIGS. 4 and 5 a suitable design of keyboard according to the present invention is shown. A plurality of pads 80, 82, 84, 86, 88 and 90 of electrically conductive thin material are shown for explanation. The number of pads may be increased or decreased to suit the individual requirement. For example a 4×3 array may be provided or a full keyboard of 64 or more characters. The pads 80 etc are attached to a base plate 92 and on the opposite side of the base plate 92 is an artwork film 94. The artwork can identify the keypads by number or by other function as desired for each purpose. It is therefore interchangeable and can be used for reducing the number of keys seen by the user by blanking the surplus keys on a standard keyboard The keypads not seen by the user may be used for drift compensation as described hereinafter or may be disconnected. The artwork is fixed, preferably by glueing to the glass 16. Connection pads 96 are provided for output connection to analogue multiplexer 66. A guard track 98 is provided on the keyboard 12 to reduce coupling between pads. This guard track 98 may be connected to earth as shown in FIG. 5.

Alternatively the keyboard could be made by lightly metalising transparent plastic or glass so that each keypad or the whole keyboard will be transparent. This enables the keyboard to be back lit or enables the user to see through the keyboard to a display mounted for example on the back of the keyboard This display could be an LCD or other type of display enabling the keyboard to present information, or to ask questions of the user or to display areas to be touched, which areas may be readily changed This technique can be used in a self-contained access unit/keyboard for a computer which would operate on touch with no mechanical movement required.

For this embodiment the keyboard shown in FIGS. 4 and 5 would be modified, since the artwork 94 would not be necessary. The increased sensitivity and freedom from error of the present system enables the common electronic circuitry 14 to be sited remotely from the sensing pads (i.e. not directly on the back of the pads).

In a practical embodiment the circuitry 66, etc. may be eight inches or more from the individual keypads. This enables the above described transparent display to be achieved.

In an alternative embodiment, the keyboard may also be used as an X-Y position indicator.

If the guard rail 98 is omitted, then greater coupling will occur between pads. If a finger is placed on a keypad an output will occur and be detected as above, but if the finger is moved to a position between pads, then two or more pads will give detectable outputs. This may be used to "track" the position of a finger anywhere on the keyboard By use of suitable known processing circuitry the position of the finger may be displayed on a screen as a cursor.

An intermediate finger position between keypads can be used to indicate a separate function if desired. Thus, more functions may be provided than there are keypads on the keyboard It should be noted that it may be valid for more than one key to be touched at one time. For example for a specific function one key may be continuously touched whilst touching a variety of other keys in a similar manner to a shift key on a typewriter.

In an alternative arrangement, one set of lines (for example 0 to 3) may be connected to rows of keypads and the remainder (4 to 7) to columns giving a matrix arrangement. By multiplexing the inputs the number of keypads may be greatly increased—a sixty four keypad array would require only sixteen (8+8) lines, thus allowing large numbers of keys without a substantial increase in the common circuitry Detection could be obtained for example by looking for a maximum row reading and then for a maximum column reading, thereby identifying the intersection giving the identity of the touched key.

Figure 6:
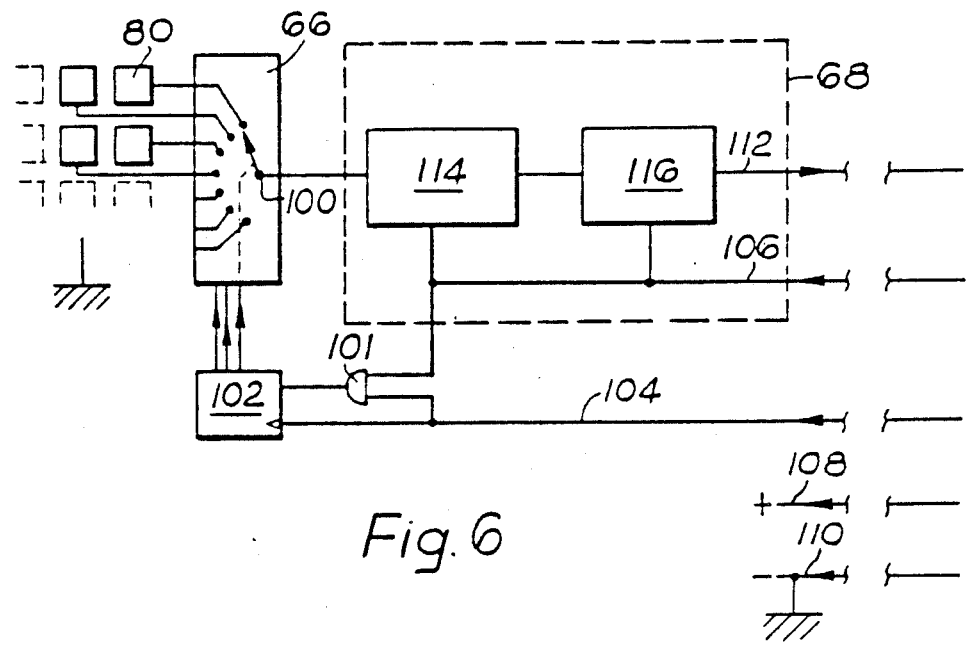
FIG. 6 shows in block diagrammatic form the keypad of FIG. 4 and associated circuitry according to the present invention.

With reference now to FIG. 6, each keypad 80 etc is connected to a respective contact of analogue multiplexer 66. The multiplexer 66 is preferably an integrated circuit with semiconductor switch connections operative to connect in sequential order each of the input contacts to the common switch contact 100 under the control of an indexing counter 102. The indexing counter is clocked by a remote clock, on wire 104, obtained by counting down a fast clock in a counter 105 (see FIG. 9) from interface 22 (FIG. 1). The total number of wires in lead 18 from interface 22 is five comprising clock wire 104 reset wire 106, power wires 108, 110 and output data wire 112. The positive lead 108 can be eliminated by using the wires 104, 106 to provide power for charging a capacitor (not shown) in the keyboard interface 14 for powering the interface.

If more wires are allowable in lead 18 then counter 102 could be eliminated, three wires being used for direct access to eight keypad inputs, four wires for sixteen keypad inputs, etc The reset pulse is used to reset the analogue multiplexer at set intervals to ensure correct synchronism between the multiplexer 66 and the computer interface 22 and hence computer 20.

The output of multiplexer 66 is fed to the control input of a capacitance controlled oscillator 114, the output of which is connected to a divide by N circuit 116 which provides the data output on wire 112 The reset pulse on line 106 resets divider 116 and inhibits operation of oscillator 114 as described hereinafter with reference to FIG. 8.

Figure 7:
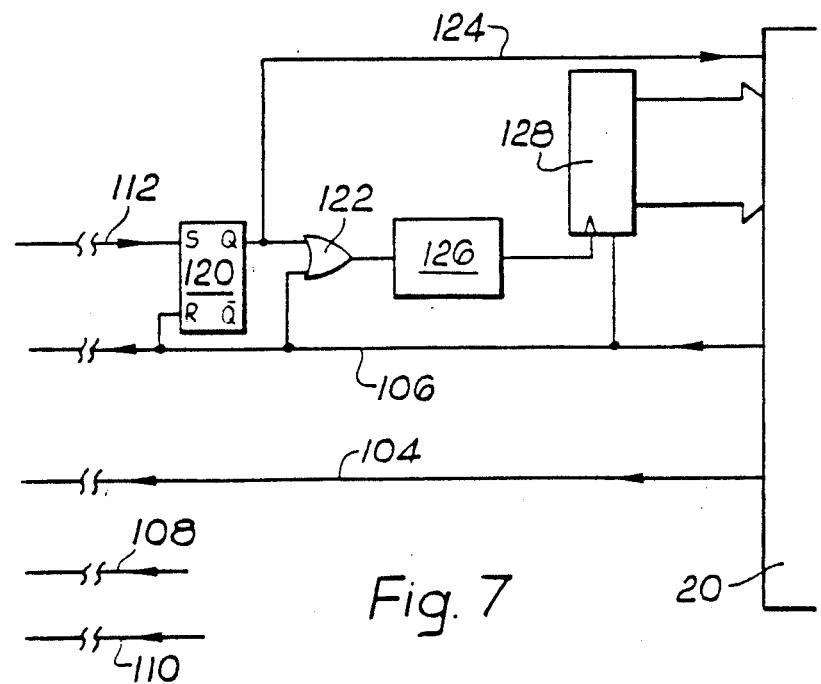
FIG. 7 shows in block diagrammatic form, a computer interface according to the present invention for co-operation with the circuitry of FIG. 6.

With reference now to FIG. 7 the computer interface circuitry 22 comprises an R-S flip flop 120 the set input of which is connected to data line 112 and the reset input of which is connected to reset line 106 so that the R-S flip flop is reset at the same time as the divider 116. The Q output of flip flop 120 is fed to one input of an OR gate 122 and to an interrupt input 124 of the computer 20. The other input of OR gate 122 is connected to the reset line 106. The output of OR gate 122 is used as an inhibit input to a fixed frequency oscillator 126 the output of which is fed to the clock input of a counter 128 which is also reset by the reset pulses on line 106. The count output of counter 128 is fed to the computer input/output port.

Figure 8:
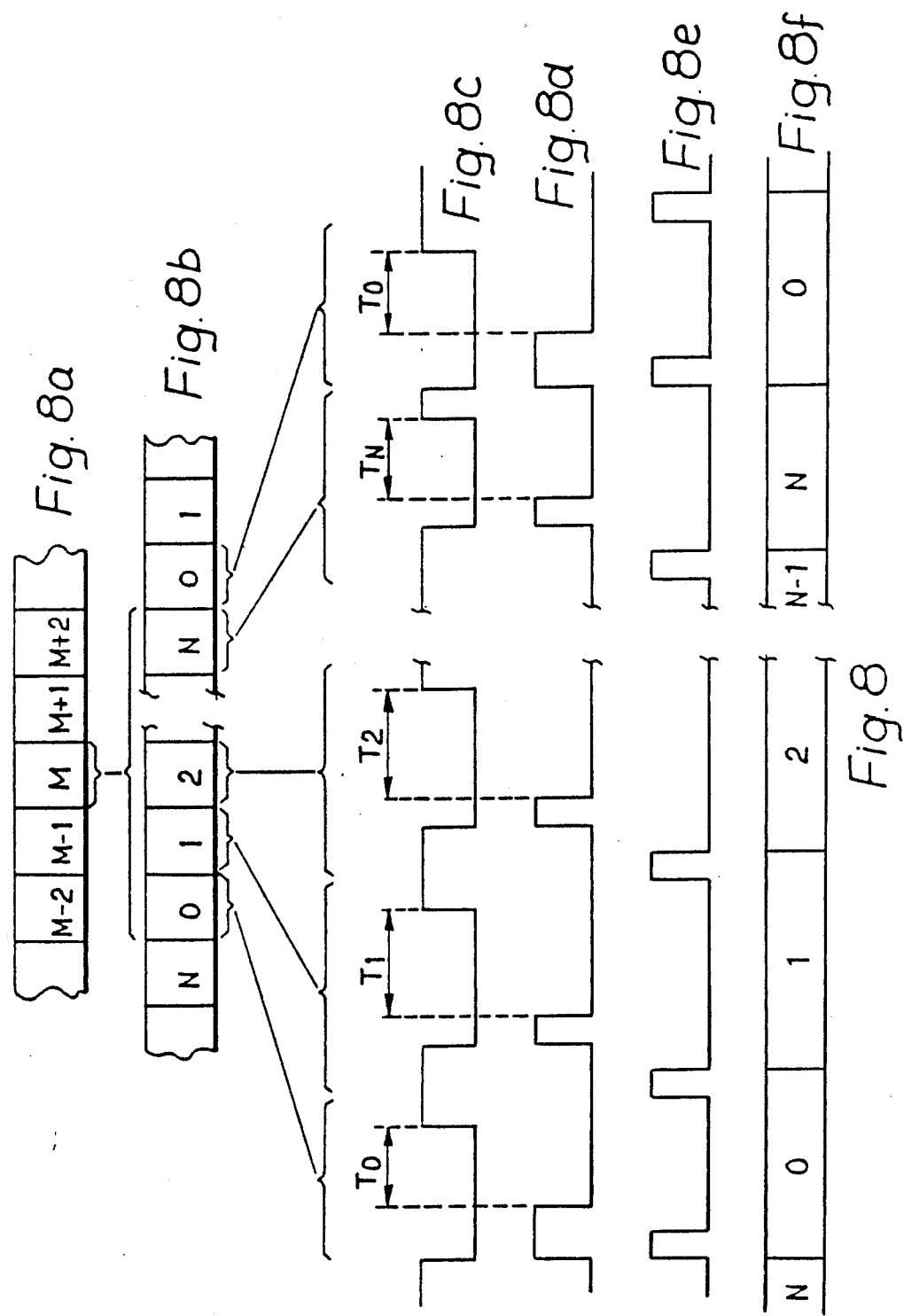
FIGS. 8a–8f show timing diagrams for the circuitry of FIGS. 6 and 7.

The operation of the circuitry of FIGS. 6 and 7 may be seen from the timing diagrams of FIG. 8. The computer continuously scans all keys and repeats the operation as shown in FIG. 8a. Scan operation M is shown in greater detail in FIGS. 8b to 8f. In each scan cycle a synchronising operation commences the cycle, followed sequentially by the reading of all desired keys in the order in which they are connected to analogue multiplexer 66. In this case keys O to N are read in order. In the first portion of each read sequence (see FIGS. 8c-f) the clock and reset pulses are present simultaneously thus resetting counter 102 and hence analogue multiplexer 66 to its zero position and inhibiting oscillator 114 for the period of time that the reset pulse is present. At the end of the reset pulse oscillator 114 commences to run at a frequency determined by the capacitance seen on the common contact 100 of multiplexer 66. This capacitance will be that of the key pad "O" and also stray capacitances of leads and multiplexer 66. The latter stray and multiplexer capacitances will be substantially common—assuming that the leads between multiplexer 66 and each pad 80 etc are substantially of the same length and that the guard track 98 reduces spurious effects on individual tracks. Thus the oscillator frequency will depend on the capacitance of each keypad.

The output of oscillator 114 is connected to a divide by N circuit 116 which is turned on by the falling edge of the reset pulse and counts down from a predetermined setting the oscillations from oscillator 114. The output of divider circuit 116 is at zero volts until the count reaches zero (or a predetermined number) when the output switches to a positive voltage. At this time ($T_0$ for pad O) a positive step is sent down line 112. Thus the interval $T_O$ indicates the frequency of operation of oscillator 114 averaged over the period $T_O$.

After an interval long enough to ensure that the signal has been sent for all reasonably expected values of capacitance a further clock pulse is sent to clock counter 102 by one step thus causing analogue multiplexer 66 to step on one position thus connecting the next keypad to common contact 100. The next reset pulse does not overlap with this clock pulse and therefore counter 102 is not reset to zero because AND gate 101 does not give any output pulse. At the end of the reset pulse divider/counter 116 commences to count the output cycles from oscillator 114 and when it has reached zero (or a predetermined count) after time $T_1$ a positive voltage step is sent down data line 112 This process is repeated (see FIG. 8f) for all N keys and then the cycle is recommenced by sending a reset and clock pulse simultaneously. The timing of the pulse sequences can be by a specially designed clock pulse generator (not shown) in the computer interface 22 or by a simple timed control program in computer 20.

Thus after each reset pulse a time interval $T_0$, $T_1$ etc is determined before a positive pulse is sent to flip flop 120 (FIG. 7) respective time intervals being proportional to the capacitance of each respective keypad. As the pulse sent is a positive step rather than a series of very rapid pulses it is not susceptible to interference on line 18 as would be the case if the output of oscillator 114 were transmitted over the cable link 18.

The flip flop 120 is reset by each reset pulse and set by the positive going edge of the data pulse on line 112. Thus OR gate 122 will inhibit the fixed frequency oscillator at the time of the positive edge of the data pulse, the oscillator having commenced at the falling edge of the reset pulse. The output of oscillator 126 is counted by counter 128 which therefore gives a very accurate digital read out proportional to the times $T_0$, $T_1$ etc. This read out is transferable as a parallel operation into the computer or other decision circuitry.

Figure 9:
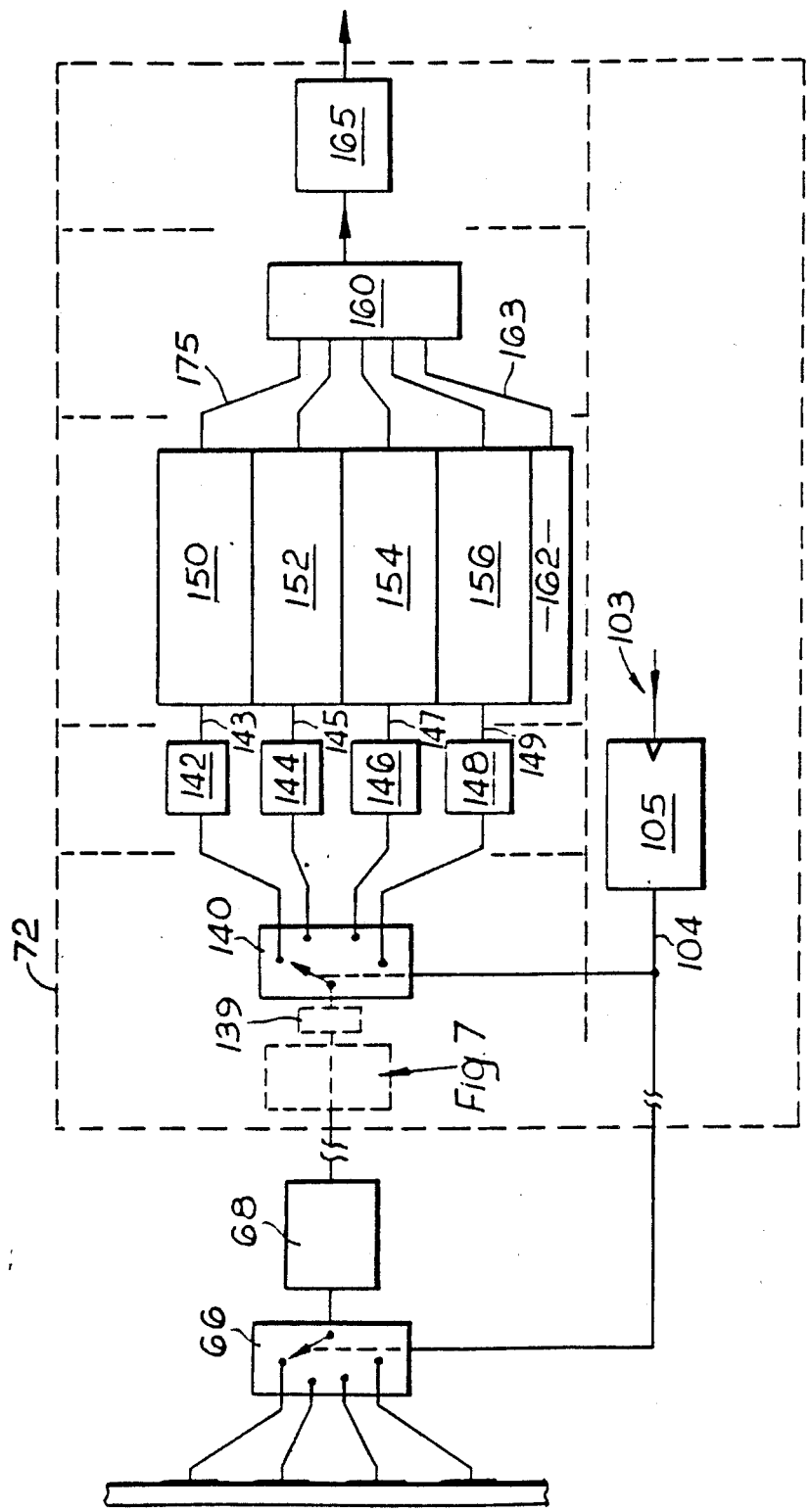
FIG. 9 shows in block diagrammatic form one possible decision making circuit for the keypad system according to the present invention.

With reference now to FIG. 9, the decision circuitry is shown for an analogue decision logic circuit. In this circuit the counter 128 output of FIG. 7 is fed to a D to A converter 139, the output of which is connected to an analogue multiplexer 140 which is synchronised to the analogue multiplexer 66. The output of the D to A converter may be stored in respective sample and hold circuits 142, 144, 146, 150. Thus each sample and hold circuit 142 etc will hold at the end of each scan sequence an analogue value proportional to the capacitance of its respective keypad. The output of each sample and hold circuit is connected to a respective signal processing circuit 150, 152, 154, 156 the outputs of which are connected to a maximum signal detector circuit 160. The signal processing circuits 150–156 are modified in operation by a threshold and drift circuit 162 the operation of which will be described with reference to FIG. 10.

The maximum signal detection circuit 160 operates in known manner to select the highest input signal and to indicate on its output the keypads which give the largest response. If no keypad response is higher than a certain threshold set by the threshold and drift compensation circuit 162 then no output is given by detector 160 indicating that no keypads have been touched.

The output of detector 160 may be fed to a computer code look up table 165 which may operate the computer 20 to display on a screen 24 a display for viewing by the operator of the keypad. The display could be of the static type giving information for example on railway timetables obtained from storage 30 or it could be a video film for example for a travel agents, the film being selected by tape counter selection means set by the computer in the V.C.R. 28.

Figure 10:
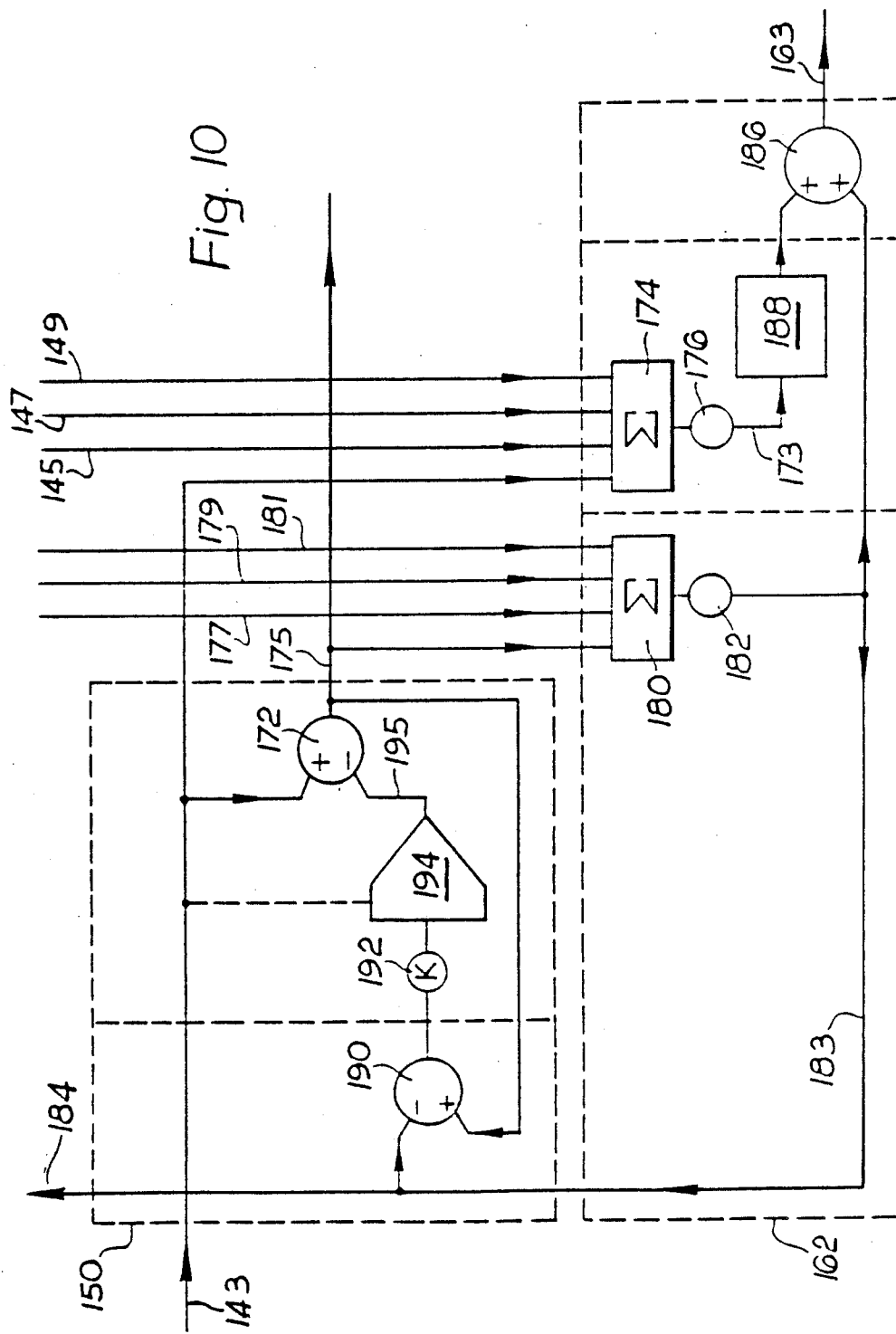
FIG. 10 shows in greater detail in block diagrammatic form the signal threshold and drift processing circuitry of FIG. 9.

The threshold and drift compensation circuit is shown in FIG. 10 in which a single key is considered. The circuitry of the signal processor is duplicated for each key. The sample and hold circuitry is standard and is therefore not shown but forms the input signal on lines 143, 145 etc to each signal processor 150 etc.

Each signal from a sample and hold circuit 142, 144, 146, 148 etc on lines 143, 145, 147, 149 etc is fed to the positive input of a summation circuit 172 and also to one input of an accumulator circuit 174 in the threshold and drift compensation circuit 162. The output of the accumulator 174 is fed to an attenuation by N circuit 176, the number N being chosen to be the number of keypads being sensed. As stated hereinbefore this could be a greater number than would be visible to the user, those not being visible being used as reference pads. The output on line 173 will therefore be a voltage proportional to the average of the capacitance on all keypads measured.

A further value is calculated in a second summation circuit 180 and associated second attenuation by N circuit 182. The voltage output of divider 182 is proportional to the average change and is obtained by adding together the outputs of summation circuit 172 and its counterparts (not shown). Since the output of comparator circuit 172 is proportional to the difference between the latest scan reading and the previous scan readings then this value represents the change in capacitance. This is averaged to provide on line 183 the average change value which is used in all the signal processing circuits 150, 152, 154, 156 etc as represented by arrow 184.

The average change value is also combined in adder 186 with the background threshold which is a function of the average key capacitance obtained in circuit 188, to obtain the threshold value on line 163 (see FIG. 9). This value is used to determine in signal detector circuit 160 which if any of the keys is being touched by comparing each output value on lines 175 etc with the threshold value on line 163.

As can be seen the threshold value on line 163 will vary dependent on the condition of other keys. It is not necessary for all the keys to be used to obtain the threshold, a selection could be used particularly if a large (e.g. full QWERTY) keyboard were provided.

The output of average change detector circuits 180, 182 is fed as an input to each signal processing circuit 150, 152, 154, 156. In circuit 150 it is connected to a negative input of a summation circuit 190. The positive input is connected to the output 175 of summation circuit 172 and therefore the output of the circuits 190 in each signal processor is the difference between the present change in capacitance for that key and the average change for all keys. The output of currant 190 is fed via a circuit 192 which modifies the output by a factor K and an integrator 194, the output 195 of which is fed to the other input of circuit 172.

The output on line 175 is the change in capacitance for that key and not the absolute value. It is obtained by subtracting the output of integrator 194 which is a voltage representative of the historical value for that key from its present value.

At initialisation the integrator is given the value that is obtained during the first scan, but this value is from then on slowly modified by the capacitance difference readings on line 175 and by the drift compensation circuit. The speed of compensation is determined by factor K preset into circuit 192. Factor K is a time constant which is set long in relation to key pressing but short in relation to long term drift.

Summation circuit 172 therefore compares the old value on line 195 with the new value on line 143 to produce an output value on line 175. If the key is not touched then no output will occur assuming all other conditions remain the same.

Figure 11A:
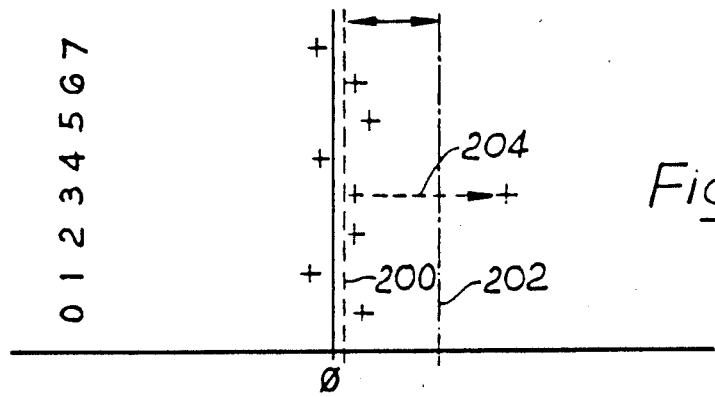
FIGS. 11a–11d show a first set of typical keypad signals from a keyboard such as shown in FIGS. 4 or 5.

With reference now to FIG. 11a typical key output signals are shown for eight keys (0-7). In a steady quiescent state with no disturbances the outputs indicated by crosses are on or about a "zero" level. This level will be due primarily to the capacitance of the glass. The average change at any scan will be very small and is indicated by dotted line 200. The threshold level is set by f(x) in circuit 188 and is shown by dotted line 202. The function f(x) permits the circuit to be used with different glass thicknesses. The glass thickness influences the capacitance of all keypads. The averaged absolute capacitance is the input to function f(x) and the output defines the background threshold (i.e. how much a key capacitance must increase from the average in order to be treated as a true pressing), f(x) was chosen empirically such that with thin glass the change in capacitance has to be large, but for thick glass the change is small. In this way the keypads maintain a uniform sensitivity when used on glass of different thicknesses and di-electric strengths. There is a readily identifiable gap between all of the outputs and this threshold level. Thus if key 3 is touched its output will rise above the threshold level 202 as shown by the dotted arrow 204 and the output will be detectable by detector 160.

Figure 11B:
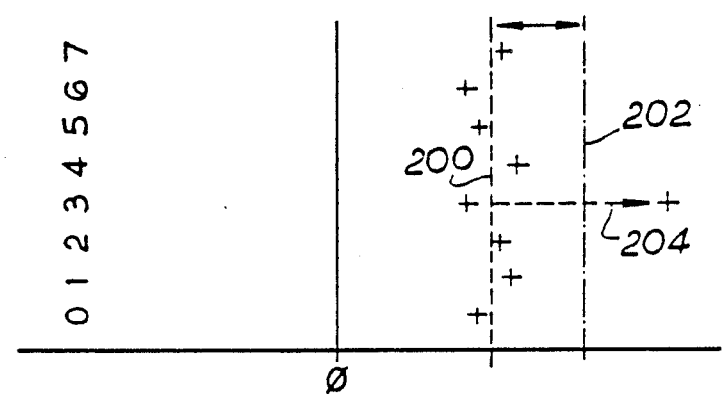

FIG. 11b shows the effect of a common mode disturbance. The average change will be very large because all keys will change together. The threshold will also change the background is added to the average change in circuit 186. Thus the situation is unaltered except that the average change and threshold lines 200, 202 are now considerably removed from the "zero" level. Touching key 3 as indicated by arrow 204 is still readily detectable.

Figure 11C:
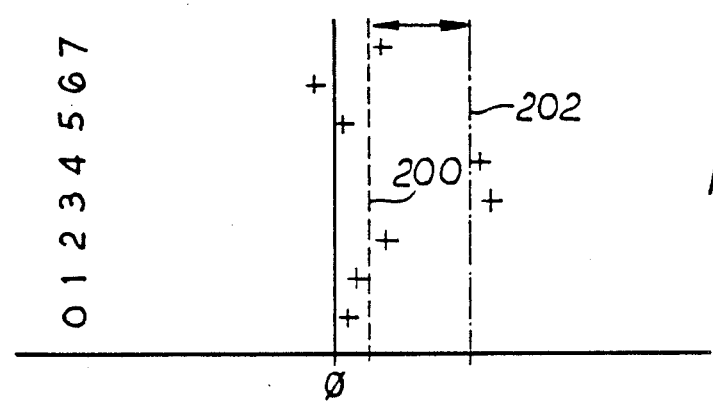

With reference to Figure 11c the effect of a differential mode disturbance is shown. In this disturbance only certain keys are affected and in this example keys 3 and 4 are assumed to be subject to a disturbance. It may be seen that the average change line 200 has hardly moved because the two large changes in keys 3 and 4 do not substantially affect the overall average of eight keys. If not corrected the circuit assumes always that keys 3 and 4 are being touched. The feedback from line 175 of the change in capacitance will however correct this after an interval determined by the factor K. Thus if the differential mode signal is not because of a genuine touching of keys 3 and 4 then this will be compensated for. If a genuine touching has occured then it is assumed that the finger or fingers will be quickly removed.

Figure 11D:
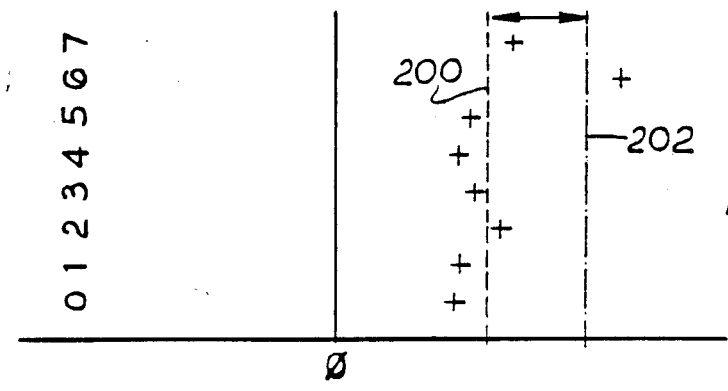

With reference now to FIG. 11d the effects of both common mode and differential disturbance are shown. The common mode results in shifting of line 200 and 202 as in FIG. 11b and the differential mode is assumed to affect only key number six. Thus key six is assumed by the logic to have been touched. This may in fact be the case or it may be as a result of a fault condition. If the latter then the integrator 194 will provide compensation.

Figure 12A:
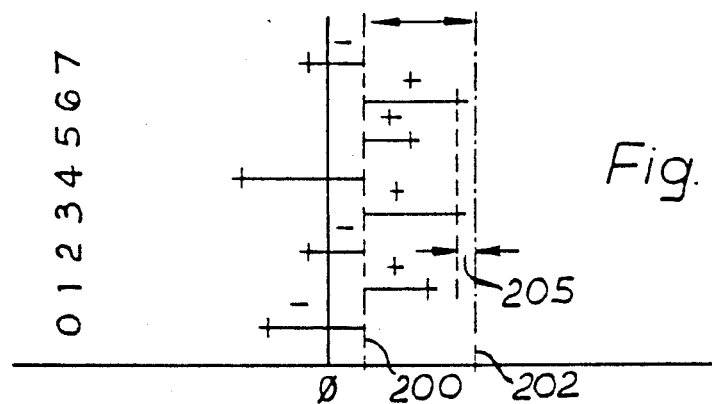
FIG. 12a–12c show effect of the drift compensation circuit of FIG. 10 on the processing of the signals of FIG. 11.

With reference now to FIG. 12a, the effects of the drifting of signals from the capacitive keys is shown. Such drift may occur with age or through the keypad gradually peeling off the glass in for example one or more areas. As may be seen from the crosses for each key the spread of values is very large so that although the average line 200 has not substantially moved the noise margin 205 between threshold line 202 and the highest reading keys (numbers three and six in this example) is very low. Additionally and perhaps more of a problem is that for a touch on the lowest reading key (number four in this example) to be detected the capacitance change would have to be approximately double the background threshold value between lines 200 and 202. This may not be possible to achieve and therefore key number four may become effectively inoperative. Also if key four is touched the "proximity" effect on key four (assuming they are adjacent) may cause key three to operate and not four. This obviously would render the keyboard absolutely useless without the compensation circuitry provided by the present invention.

Figure 12B:
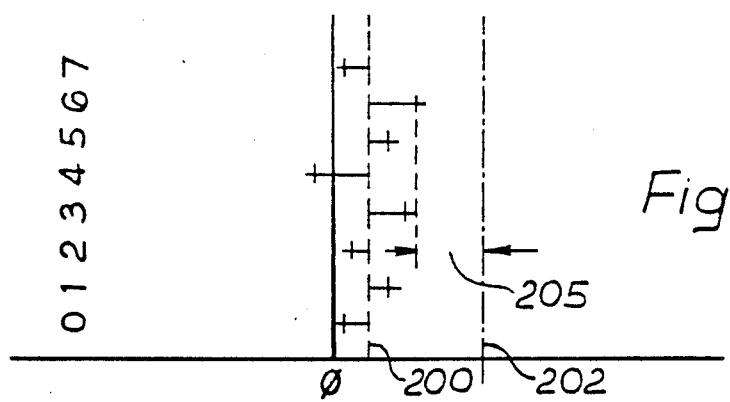

FIG. 12b shows the effect of the drift compensation circuitry. The average (line 200) and the threshold level (line 202) will not substantially vary from FIG. 12a but the effective error that each key has from the average value will be made smaller by the drift compensation provided by summation circuit 190 and integrator 194.

In this circuit the average change value signified by line 200 is compared with the actual which for example for key three in FIG. 12a is a large positive value. This value produces a positive input to integrator 194, after modification by the factor K. This in turn increases the output of integrator 194 which is subtracted from the new capacity reading on line 143 and thereby reduces the output of summation circuit 172 thus increasing the noise margin 204 as shown in FIG. 12b.

Figure 12C:
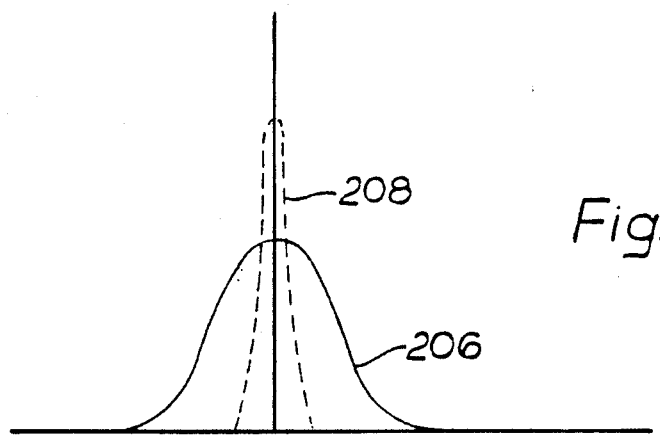

The effect on the probability of detection of a pressed key can be seen in FIG. 12c. Without drift compensation the probability curve 206 is flat with a good chance of a mistake being made. With the inclusion of the drift compensation circuit there is found to be little chance that a key touch will be wrongly detected as shown by curve 208.

With reference now to FIGS. 13 to 17 the signal processing may be carried out on a time division multiplex basis by using the same circuitry rather than separate signal processors for each key. To accomplish this the output capacitance signals from the keypad are converted into a digital format by counter 128 (FIG. 7) and are treated digitally in sequences determined by programs shown in FIGS. 13 to 17.

With reference to FIG. 13 the main program following start up goes through an initialise step and then enters a constantly repeating loop comprising three steps. Each step is described in more detail in FIGS. 14 to 17.

In FIG. 14 the initialise step comprises the steps of reading the capacitance values of all keys and replacing all the old stored key values (if any) with the new values. The values are stored in the simple and hold circuits 142, etc or in a suitable memory for subsequent use.

This completes the initialising routine and gives the sample and hold circuits a value for comparison with the next new key values.

The key scanning routine shown in FIG. 15 then commences with a start scan instruction commencing with key number zero (I=0). Each key is read and its capacitance value stored in digital form ready for comparison with the existing key value. The key number is updated by one, and if the last key has not been read then the cycle is repeated until the last key has been read. The scan key program is then complete and the next sequence shown in FIG. 16 commences using the "old" and new key capacitance values now stored.

Figures 16, 17:
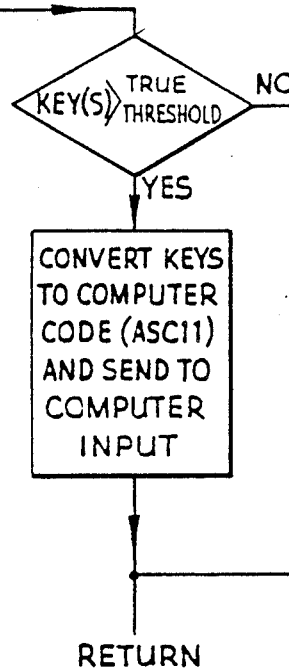
FIG. 16 shows in greater detail a routine for processing the result of the scan key routine of FIG. 15.
FIG. 17 shows a drift compensation routine for processing the results of the processing routine of FIG. 16.

The processing commences with a calculation of the output value for line 175 (NEW OLD) for each key, followed by a calculation of the average change to give the required output on line 183 or its equivalent. Then the average absolute key value is calculated as in circuit 174 and divider 176. The best background threshold level determined by f(x) which is readily alterable to suit different environmental and glass thickness conditions is known and the true threshold value is then calculated as in circuit 186. The new key values are compared with the old and the key or keys with the largest changes are found and compared with the threshold. If a key is detected as exceeding the threshold then a YES output is given to for example an ASC11 code converter to output ASC11 code for control of any remote function. When this has been completed, or if no keys have been detected then the drift compensation sequence is commenced as shown in FIG. 17.

The first key (I=0) is selected and its error from the average change is calculated and then the old stored value is updated—normally fractionally to compensate for drift. The next key (I=1) is selected and the process continued until all keys have been updated. The program then recommences as shown in FIG. 13.

Thus the circuitry can be analogue or can be digital with a simple program to allow time division multiplex use of the same circuits to sequentially calculate the desired values. It is possible in such a program to use an average value of several reading during the initialisation stage thus making the system more accurate from switch on.

Figure 18:
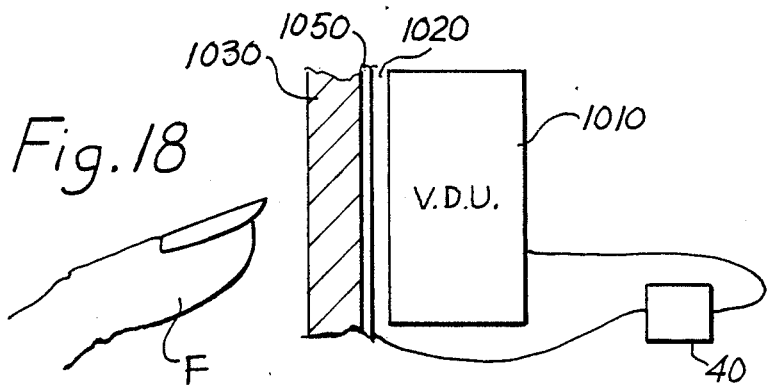
FIG. 18 shows diagrammatically in side cross section a display system according to the present invention.

With reference now to FIG. 18 the display system comprises a visual display unit 1010 a transparent keypad 1020 and a sheet of glass (as defined), for example a window 1030 against which the keypad 1020 is in a first embodiment affixed. The keypad is operated by touching the window 1030 with for example a finger F. The keypad may be operated by bringing the finger F into close proximity to the glass window 1030 without actually touching the window The glass may be single, double or triple glazed, the keypad being sensitive enough to work through several layers of glass and the air gaps in between. The VDU can be any type of display, e.g. CRT liquid crystal, fluorescent or projected, etc.

The keypad has, associated therewith a control box 1040 which is able in known manner to control the VDU either directly or for example to control a video recorder (not shown) associated therewith. The keypad is stuck or otherwise fixed to the window 1030 or is in proximity behind the window being supported by separate means and by touching the window the display on the VDU 1010 may be changed. The VDU display may be used to indicate the areas of the screen to be touch to alter the display. To suit various mounting techniques the VDU and keypad may be positioned as shown pressed against the glass. 1030 without any substantial gaps or spaced apart as indicated by gaps 1050 and/or 1060. The keypad is sufficiently sensitive to be operable with a substantial gap 1050. Gap 1060 is preferably small to prevent parallax between displayed touch area and the keys.

The sensitive areas of the keypad in front of the display may be constructed by for example sputter coating indium oxide onto a polyester film or depositing tin onto glass.

Figure 24:
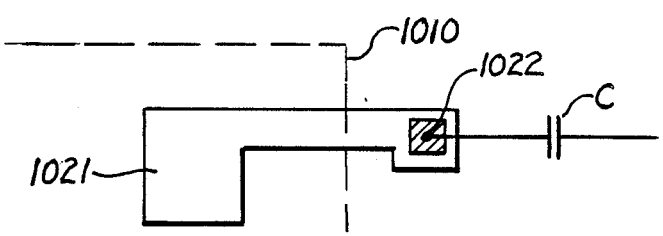
FIG. 24 shows diagrammatically an electrical circuit of the keypad of the present invention.

In an alternative embodiment the keypad may be fixed to the front of the VDU 1010. The VDU 1010 may then be positioned close to the inside of a window 1030 and providing the air gap between the window glass and the keypad is relatively small the keypad and hence the VDU may be operated by touching the window as shown. Fixing the transparent keypad to the front of a CRT display (e.g. a TV) however causes the keypad to be subjected to the static produced by the TV and it is necessary to counter this as shown in FIG. 24 by for example connecting a capacitor C in the output lead from each key to isolate the detection circuitry in control box 1040 from the static (d.c.) voltage.

Figure 19:
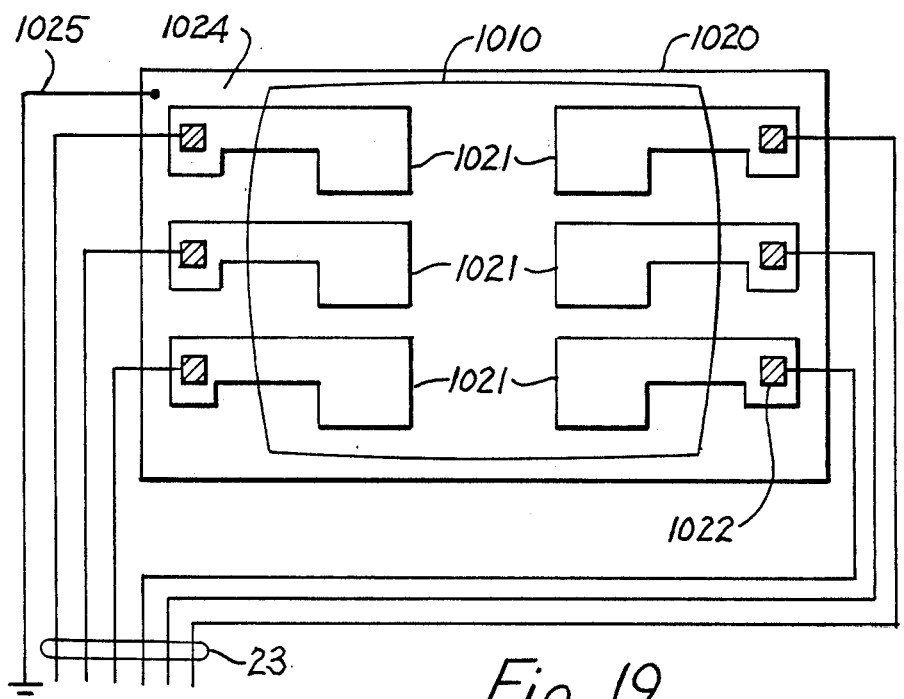
FIG. 19 shows diagrammatically the visual display unit VDU and transparent keypad in front elevation.

With reference now to FIG. 19 the keypad 1020 is shown as viewed through window 1030. The sensor areas are indicated at 1021 and contact areas are shown at 1022. Individual output leads 1023 join the contact areas 1022 with the control box 1040 which operates to control the VDU as above described with reference to devices 14, 22 and 20 of FIG. 1.

The control box 1040 may be provided with appropriate output drives for control of the VDU (or video recorder). An area 1024 surrounding the sensor areas 1021 may be connected via lead 1025 to ground to improve the sensitivity of the keypad and help eliminate static.

Figure 20:
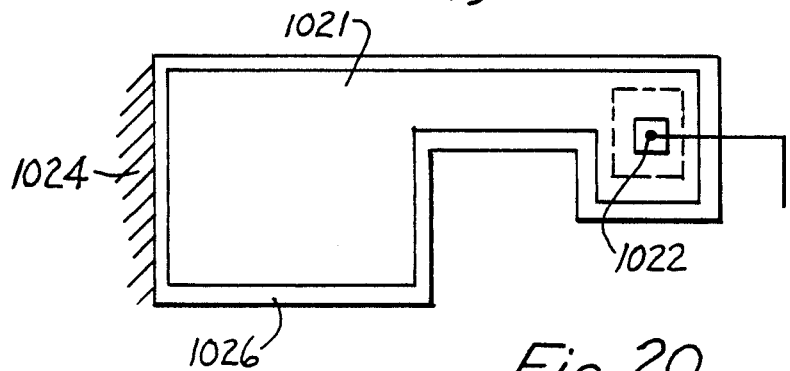
FIG. 20 shows in greater detail a keypad used in the system of FIG. 19.

An individual key is shown in greater detail in FIG. 20, the sensitive area 1021 extending as shown over the contact area 1022. The conductive sensor area 1021 is isolated from other sensors by a non-conductive zone 1026.

Figure 21:
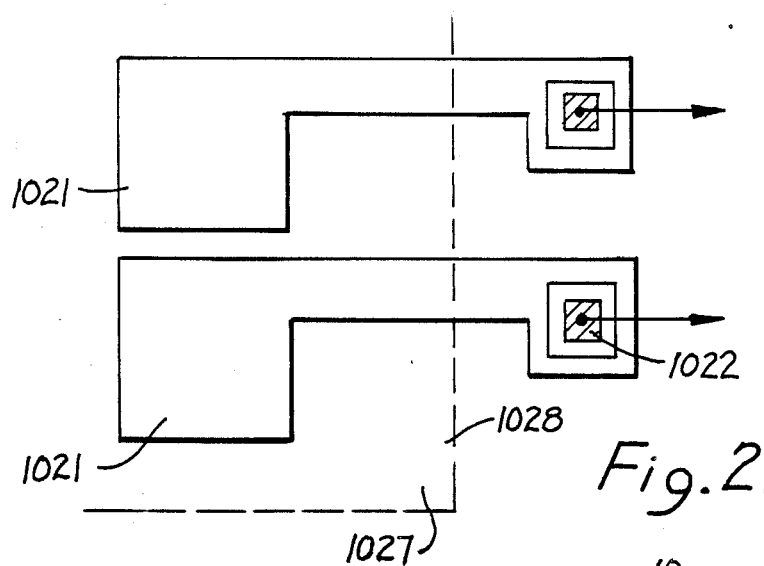
FIG. 21 shows an alternative design of keypad.

In FIG. 21 the sensor areas 1021 are within a central area 1027 which is visible in front of the VDU. The conact areas 1022 may be screened behind an opaque surround 1028 for cosmetic purposes.

Figure 22:
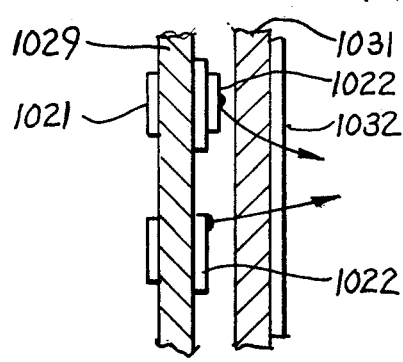
FIG. 22 shows in cross section a first design of keypad.
Figure 23:
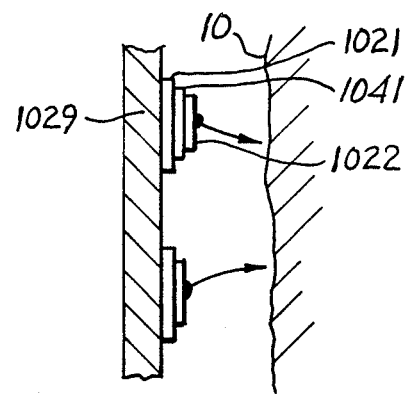
FIG. 23 shows in cross section a second design of keypad.

The contact areas 1022 may be glued to the sensor areas 1021 as shown in FIG. 23 or may be glued to the opposite side as shown in FIG. 22.

An alternative solution to the static problem is to provide a sheet 1031 of plastics material with a conductive coating of for example indium oxide 1032 which is grounded. The coating 1032 will remove the static from the VDU allowing the keypad to sense in a normal manner.

If there are no problems of static or a separate in line capacitor is used the connector 1022 may be directly connected to the transparent conductive film 1021 by for example conductive adhesive or a push on connector.

In the upper key contact of FIG. 22 the transparent conductive coating forming the sensitive area 1021 is applied for example by sputtering indium oxide onto one side of a glass or plastics sheet 1029, the contact 1022 being affixed to the other side The glass or plastic sheet 1029 forms the dielectric capacitor C required for anti-static properties as referred to with reference to FIG. 24.

In FIG. 23 the sheet 1029 forms a shield or guard sheet in front of for example a VDU 1010 enabling the sensitive areas and contacts to be protected against damage.

The capacitor C may be formed as shown in the upper contact by introducing a sheet of for example polyester 1041 to form a dielectric between the sensitive areas 1021 and contact area 1022 at the point of the contact area. Conveniently the sheet 1041 may be double sided tape providing adhesive contact on both sides.

FIGS. 25 to 30 show various possible exemplary key arrangements for displays where static voltages are present and for those where there is no problem of static such as in LCD displays. The same reference numerals are used to designate the various parts as in FIGS. 18 to 24.

FIGS. 25, 26 and 27 show possible construction methods where there is no problem of static.

FIG. 25 is a cross section of a display unit 1010, such as a fluorescent or liquid crystal display where the sensors are on the inside of the front glass panel of the unit.

FIG. 26 is a cross section of a display unit where the sensors are on the outside of the front glass panel of the unit.

FIG. 27 shows sensors mounted on a separate sheet of glass or door plastic and situated between the viewer/operator and the display.

Figure 30:
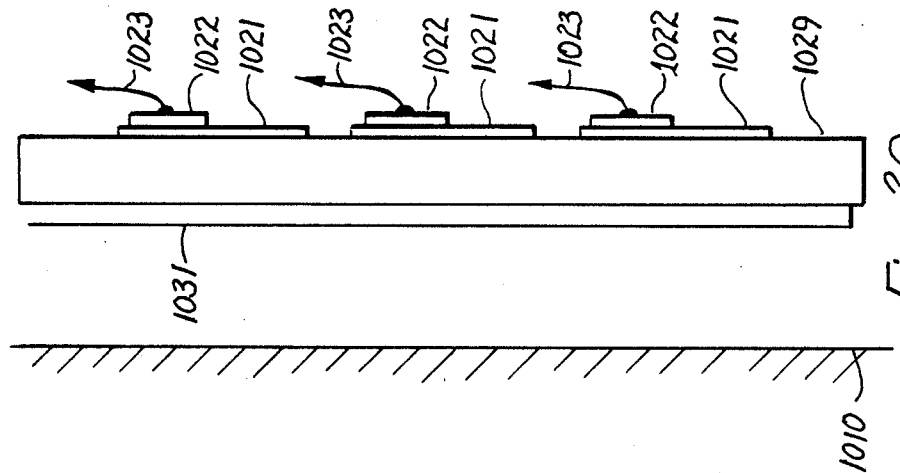
Figure 29:
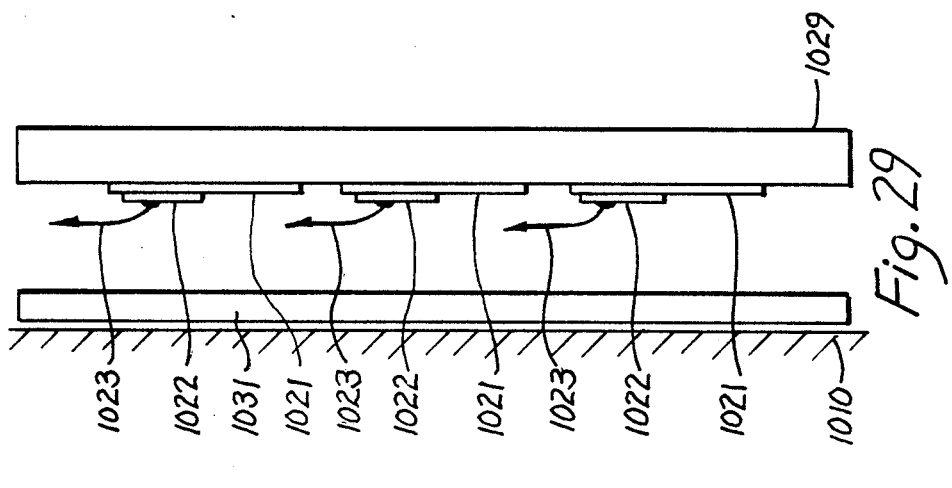
Figure 28:
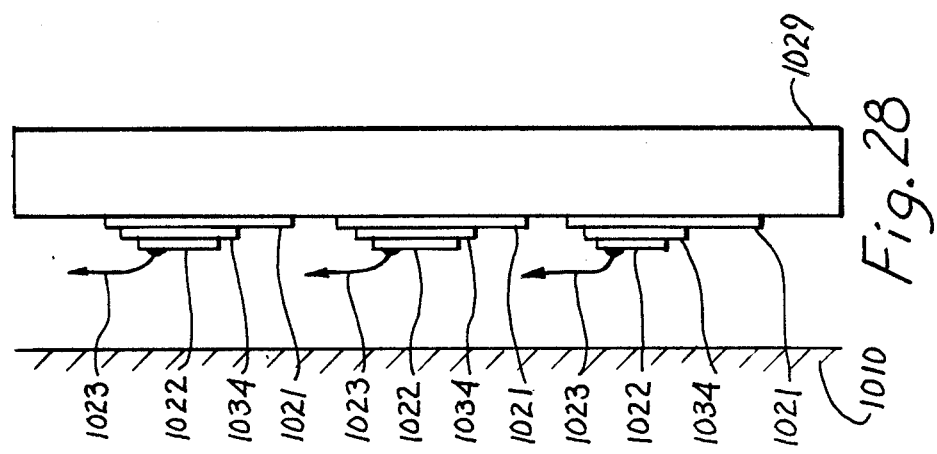

FIGS. 28, 29 and 30 show possible construction methods where there is a problem of static.

FIG. 28 shows the construction of the pick-up terminals where they are isolated from the sensor areas by a thin sheet of non-conductive material. This prevents high voltages reaching the electronic circuit.

FIG. 29 shows a layer of transparent conductive material 1031 placed between the VDU and the sensors. When this is grounded the static is eliminated.

FIG. 30 shows how the grounded transparent shield and the sensors may be mounted on either side of the same sheet of glass or clear plastic.

I claim:

1. A touch operated key apparatus including a sheet of glass, a keyboard comprising a plurality of keypads, means for attaching the keyboard to the sheet of glass to operate the keypads through the sheet of glass, means for displaying data and for controlling processes selectable by the keyboard, said apparatus further including processing circuitry for processing signals from the keypads of the keyboard and interrogation means for interrogating the output signals from at least one of the keypads, sensing means associated with the keyboard for detecting and for processing the outputs of the at least one of the keypads, said sensing means including a plurality of signal processing circuits for receiving a respective signal from a respective keypad, a long term drift compensation circuit connected to receive respective signals from several of the keypads for generating a drift compensation signal value and a store for storing the drift compensation signal value, comparison means for comparing the output of the respective signal processing circuits of the keypad being interrogated with the output of said signal processing circuit of at least one other keypad and with the stored drift compensation signal to determine as a result of the comparisons whether the keypad being interrogated has been touched, average change generation means for continually generating an average change signal representative of the average of the last changes in at least two of the keypads, an intergration circuit for generating a summation of previous average change signals, each of said signal processing circuits including an average signal comparator for comparing the output signal from a respective keypad with the summation signal generated by said integration circuit, means for modifying the output signal of said respective signal processing circuits by the output signal of said average signal comparator in proportion to the difference between the change in output signal for the respective keypad and the average change for all of the interrogated keypads, said comparison means being operative for comparing the differences between the change in output signal for each respective keypad and the average change for all interrogated keypads instead of the absolute value of the output of each respective keypad.

2. A touch operated key apparatus as claimed in claim 1, wherein the plurality of keypads are disposed adjacent each other in a desired pattern, said sensing means including further interrogation means for interrogating each keypad to assess the present condition of each keypad and signal processing means for receiving the output of each keypad, said signal processing means including common processing means for two or more of the keypads.

3. A touch operated key apparatus as claimed in claim 2, in which said common processing means is connected to process the outputs of all keypads on the touch operated keyboard.

4. A touch operated key apparatus as claimed in claim 2 in which at least one of the keypads is used for comparison purposes only and is not an operational keypad.

5. A touch operated key apparatus as claimed in claim 2 in which the output signal from each keypad is in the form of a value of capacitance which value changes in accordance with a number of extraneous factors and in accordance with an operation factor, said signal processing means including means for detecting changes of output signal at at least one of the keypads due to the extraneous factors and means for comparing these detecting changes with a signal received from an interrogated keypad to detect an operation factor.

6. A touch operated key apparatus as claimed in claim 1 including a visual display unit operable under the control of said output of the sensing means for displaying required information.

7. A touch operated key apparatus as claimed in claim 6, in which the sheet of glass is a shop window and in which the displayed information is selectable from recorded data.

8. A touch operated key apparatus as claimed in claim 5 including a guard rail disposed between each keypad for reducing coupling between the pads.

9. A touch operated key apparatus as claimed in claim 5 in which a guard rail is not present between keypads so that the keyboard may be used as a X-Y sensor area.

10. A display system for shop windows including a touch operated key apparatus as claimed in claim 1, in which said apparatus includes a visual display unit, a video recorder for storing information and a computer for displaying the information on said visual display unit, whereby the information stored in said recorder is selectable by said computer for display on said visual display unit in accordance with instructions received from the keyboard.

11. A touch operated key apparatus as claimed in claim 3, in which at least one of the keypads is used for comparison purposes only and is not an operational keypad.

12. A touch operated key apparatus as claimed in claim 3 in which the output signal from each keypad is in the form of a value of capacitance which value changes in accordance with a number of extraneous factors and in accordance with an operation factor, said signal processing means including means for detecting changes of output signal at at least one of the keypads due to the extraneous factors and means for comparing these detected changes with a signal received from an interrogated keypad to detect the operation factor.

13. A touch operated key apparatus as claimed in claim 11 in which the output signal from each keypad is in the form of a value of capacitance which value changes in accordance with a number of extraneous factors and in accordance with an operation factor, said signal processing means including means for detecting changes of output signal at at least one of the keypads due to the extraneous factors and means for comparing these detected changes with a signal received from an interrogated keypad to detect the operation factor.

14. A touch operated key apparatus as claimed in claim 4 in which the output signal from each keypad is in the form of a value of capacitance which value changes in accordance with a number of extraneous factors and in accordance with an operation factor, said signal processing means including means for detecting changes of output signal at at least one of the keypads due to the extraneous factors and means for comparing these detected changes with a signal received from an interrogated keypad to detect the operation factor.

15. A touch keypad apparatus as claimed in claim 1 wherein the keypad is transparent and including a visual display system unit having a front and being located to be viewed at least in part through the keypad.

16. A touch keypad apparatus as claimed in claim 15 wherein the keypad is attached to the front of said visual display unit and including a sheet of transparent dielectric material, said visual display unit being positioned adjacent one side of said dielectric material and controllable by an operator touching the other side of said dielectric material.

17. A touch keypad apparatus as claimed in claim 15 or claim 16 including means for sensing the touching by an operator of a key of the keypad when the keypad is in close proximity to said visual display unit and in the presence of static voltages attendant said visual display unit.

18. A touch keypad apparatus as claimed in claim 15 or claim 16 in which said visual display unit includes a display selected from incandescent, fluorescent and LCD displays and from an other display which does not generate static voltages.

19. A touch keypad apparatus as claimed in claim 15 including a sheet of transparent dielectric material and means for positioning said visual display unit adjacent to but not in contact with said dielectric material to develope an air gap between said visual display unit and said dielectric material.

* * * * *